United States Patent [19]
Bohlen et al.

[11] 4,334,156
[45] Jun. 8, 1982

[54] METHOD OF SHADOW PRINTING EXPOSURE

[75] Inventors: Harald Bohlen, Boeblingen; Helmut Engelke, Altdorf; Werner Kulcke, Boeblingen; Peter Nehmiz, Stuttgart; Johann Greschner, Pliezhausen, all of Fed. Rep. of Germany

[73] Assignee: International Business Machines Corporation, Armonk, N.Y.

[21] Appl. No.: 70,453

[22] Filed: Aug. 28, 1979
(Under 37 CFR 1.47)

[30] Foreign Application Priority Data

Aug. 29, 1978 [DE] Fed. Rep. of Germany ....... 2837590

[51] Int. Cl.³ .............................................. H01J 37/00
[52] U.S. Cl. ................................. 250/491; 250/492.2
[58] Field of Search ................... 250/492 A, 491, 396, 250/398

[56] References Cited
U.S. PATENT DOCUMENTS

| | | | |
|---|---|---|---|
| 3,745,358 | 7/1973 | Firtz et al. | 250/492 A |
| 3,876,883 | 4/1975 | Broers | 250/491 |
| 3,914,608 | 10/1975 | Malmberg | 250/492 A |
| 4,136,285 | 1/1979 | Anger et al. | 250/492 A |
| 4,145,615 | 3/1979 | Sumi | 250/492 A |
| 4,169,230 | 9/1979 | Bohlen et al. | 250/492 A |

*Primary Examiner*—Bruce C. Anderson
*Attorney, Agent, or Firm*—Ronald L. Drumheller

[57] ABSTRACT

A method of pattern exposing an energy beam sensitive target surface to a particle beam by proximity printing, wherein mask alignment errors such as lateral deviations, skew and linear distortions are determined and are effectively corrected by scanning the mask area being transferred with a controllably tilted particle beam, the particle beam having a diameter which is small compared to the area of the mask being scanned. At each scan point the particle beam is controllably tilted in the same azimuth direction as the alignment error for that point and by a tilt angle (taken with respect to the normal direction of the target surface) which has a tangent equal to the product of the magnitude of the alignment error and the separation between the mask and target surface at that point.

11 Claims, 6 Drawing Figures

METHOD OF SHADOW PRINTING EXPOSURE

DESCRIPTION

1. Technical Field

This invention relates to a method and to apparatus for pattern exposing an energy beam sensitive target surface to a particle beam by shadow printing. It is particularly suitable for pattern exposing a photoresist layer on a semiconductor chip through complementary masks using an electron beam, especially in the manufacture of integrated semiconductor circuits having conductive lines and circuit elements with dimensions in the sub-micron range.

2. Background of the Invention

In the production of integrated semiconductor circuits, patterns of areas must be defined on a semiconductor chip at which later process steps are performed, such as deposition of conductive material or doping with specific substances. The semiconductor chip is coated with a photoresist layer, which is then exposed through one or more pattern masks by projection printing or shadow printing and finally developed into a specific pattern.

The smallest line widths that can be achieved by optical exposure processes is about 2 μm. Alignment of masks used in successive process steps to patterns applied in preceding process steps must have a precision of at least one-quarter of the minimum line width. For the above smallest line width, alignment precision of approximately 0.5 μm is required. Since a resolution limit of approximately 2 μm was reached for known optical processes, increased miniaturization has been possible only with X-ray or electron beam exposure methods. With such energy beams, theoretical line widths of 0.1 μm and less can be reached. However, at this level of miniaturization, the required alignment accuracy of the masks with respect to the semiconductor chips could not be achieved with conventional methods in an economically satisfactory manner. Particular difficulties appeared in the use of complementary masks for electron beam exposure. The use of complementary masks requires increased alignment precision by a factor of 2 or 3.

Since no substrates exist which are transparent to electron beams or other particle beams, masks for exposure by electron beams cannot be supported by a substrate. Therefore, they can contain only patterns consisting of isolated holes. For this reason, so-called complementary masks are used for electron beam exposure, each of which contains only a partial pattern. Superposition of the partial patterns forms the required overall pattern. It is obvious that after exposure of the first partial pattern, the semiconductor chip must be realigned for exposure of the next partial pattern. Since each partial pattern contains only a fraction of the overall pattern and consists generally of pattern elements which are smaller than the elements of the overall pattern, the demands upon alignment precision are increased accordingly. The required alignment precision is 0.025 μm, which cannot be achieved by mechanical means, at least not with reasonable amounts of apparatus and alignment time.

Copending U.S. patent application Ser. No. 904,069, filed May 8, 1978 U.S. Pat. No. 4,169,230, describes a method of exposure which uses particle beam shadow printing and complementary masks. Alignment of a mask with respect to the semiconductor wafer consists of a coarse positioning, i.e., mechanically shifting the semiconductor wafer relative to the mask, and of a subsequent fine positioning, in which an exposing particle beam having a cross section at least equal to the surface to be exposed is tilted so that the point of impingement on the semiconductor wafer is laterally shifted.

It is evident that with this method the tilting of the particle beam can compensate only for overlay errors in the X and/or Y directions extending over the entire area to be exposed in a specific relative position between mask and semiconductor wafer. Certain overlay errors cannot be compensated for by means of this method such as, for example, alignment errors caused by a rotation of the mask relative to the semiconductor wafer, or by distortions of the semiconductor wafer, or by local length changes of mask or semiconductor wafer, or by local changes of the distance between mask and semiconductor wafer.

DISCLOSURE OF THE INVENTION

Since all of the above-described overlay errors can generally occur during the exposure of semiconductor wafers in the production of integrated circuits, it is not possible with prior art methods or with the method described in the above-identified patent application to economically produce integrated semiconductor circuits in the sub-micron range. It is the object of this invention to compensate for overlay errors which are caused not only by translatory lateral shifts of the entire area to be exposed in a specific relative position between mask and semiconductor wafer, but also overlay errors caused by a rotation of the mask relative to the semiconductor wafer, and by local length changes of the mask and/or of the semiconductor wafer, and by local changes of the distance between mask and semiconductor wafer.

According to the subject invention the mask region to be transferred by shadow printing in a particular relative position between mask and semiconductor wafer is not transferred at one time with a complete exposure of that whole region but instead by successive exposure of individual, preferably spot-like, subareas. All of the above-described overlay errors can then be compensated for without requiring major additional alignment apparatus or alignment time because the positioning precision of each subarea may be determined either by direct measurement or by calculation from only a few measurements and the particle beam tilted separately for each subarea exposure as required to compensate for the individual overlay error of each subarea. If the only overlay errors are caused by translation and rotation (a situation which is relatively easy to achieve if the method is executed correctly and suitable marginal conditions are selected), it will be sufficient to measure alignment accuracy at only a few locations since the overlay error or correction value for each subarea may be computed from these few measurements. This can be seen particularly well for an area which in its center is perfectly positioned but which has a rotational overlay error. With a sufficient number of small subareas this rotational error will have at each subarea only the same effect as a translational error. The amount of the effective translational error will of course be proportional to the distance which the subarea is from the rotational center. The direction of the effective translational error is obviously perpendicular to a radius line coming from the rotational center and passing through the subarea. It is apparent that measurement of positional accuracy at only a few locations (such as at markings in the four corners of the area) will be sufficient to compute the amount of the angular rotational error as well as the position of the center of rotation. Thousands of individual translational errors may then be easily computed for the individual subareas as well as thousands of different angles of tilt required to compensate for these translational errors.

In the production of integrated semiconductor circuits in the sub-micron range through use of particle beams, overlay errors can be detected with satisfactory precision, but elimination of such detected errors by translation movements on the order of 0.1 μm or less and/or rotational movements of fractions of seconds of arc has been possible, if at all, only with complicated and expensive apparatus and by using a considerable amount of time during alignment. Up to now, this has been a considerable obstacle to the use of electron beam lithography in the production of integrated semiconductor circuits with conductive lines and circuit elements dimensioned in the sub-micron range.

DESCRIPTION OF THE PREFERRED EMBODIMENT

Figure 1:
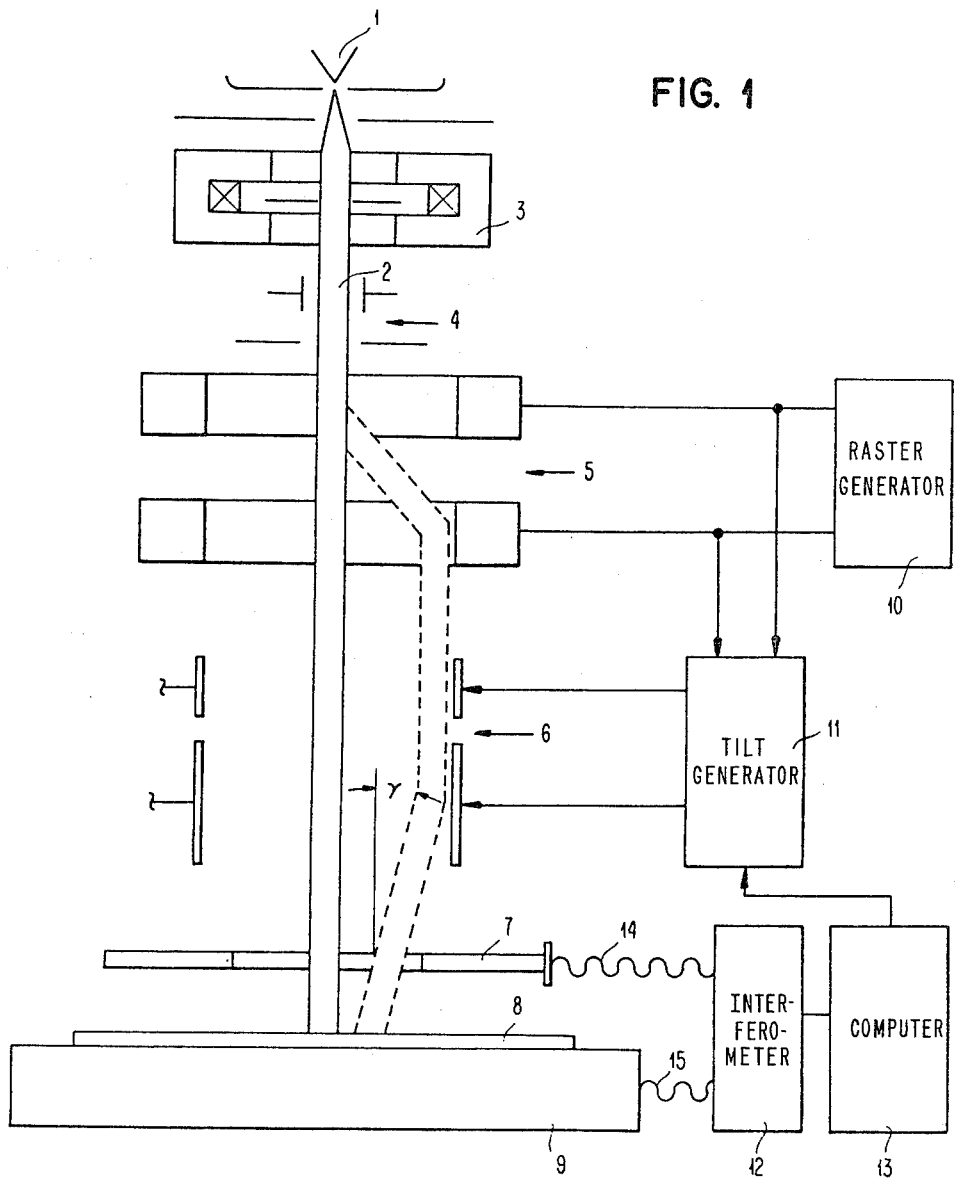
FIG. 1 is a schematic representation of an embodiment of the invention.

The embodiment of FIG. 1 consists of an electron beam source 1 for generating an electron beam 2, a collimator lens 3, a device 4 for blanking the electron beam, an electromagnetic deflector 5 for controlled steering of the electron beam, an electrostatic or electromagnetic deflector 6 for controlled tilting of the electron beam with respect to the plane of mask 7, an X-Y table 9 carrying a semiconductor wafer 8 to be exposed, a raster generator 10 for controlling electromagnetic deflector 5 to cause beam 2 to raster scan, a tilting generator 11 for controllably tilting the electron beam 2 with respect to the plane of mask 7, an interferometric arrangement 12 for measuring the positions of mask 7 and X-Y table 9, and a computer 13 for converting overlay errors between mask 7 and semiconductor wafer 8 on X-Y table 9 measured by interferometric arrangement 12 into control signals for tilting generator 11.

Figure 2:
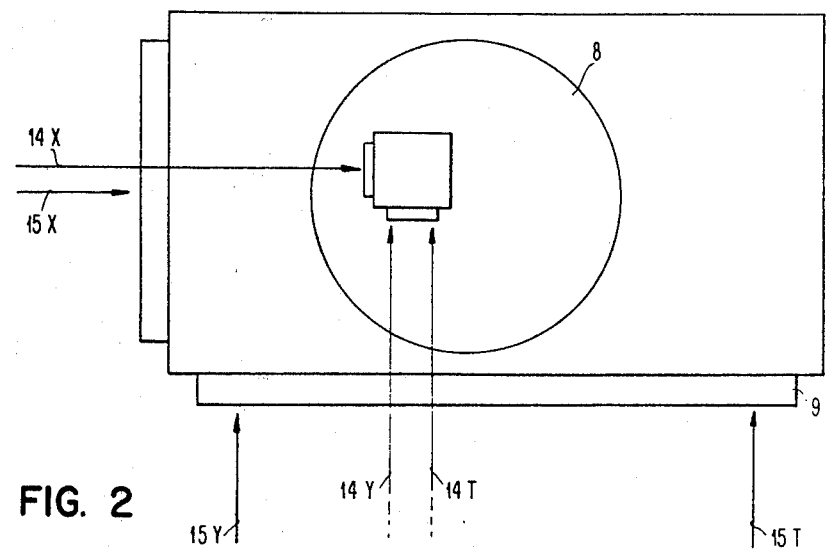
FIG. 2 is a top view of the X-Y table of the device shown in FIG. 1.

The interferometric arrangement 12 measures the position of mask 7 and X-Y table 9 and thus also of semiconductor wafer 8 in the manner shown in FIG. 2. The serpentine line 14 in FIG. 1 symbolizes three interferometric axes of which: the first, i.e. 14X, measures the position of mask 7 in the X direction; the second, i.e. 14Y, measures the position of the mask in the Y direction; and the third, i.e. 14T, in combination with the second, measures the rotational position of mask 7. The serpentine line 15 in FIG. 1 symbolizes another three interferometric axes of which: the first, i.e. 15X, measures the position of X-Y table 9 and thus also of semiconductor wafer 8 in the X direction; the second, i.e. 15Y, measures the position of X-Y table 9 or of semiconductor wafer 8 in the Y direction; and the third, i.e. 15T, in combination with the second, measures the rotational position of X-Y table 9 or semiconductor wafer 8. When larger masks are used it is of course possible to subdivide the entire mask surface into a plurality of smaller subregions, each of which may be equipped with positioning marks as is already known. By means of corresponding positioning marks arranged on the semiconductor wafer it can be determined by electron beam 2 whether the respective subregions of semiconductor wafer 8 which are to be exposed are in alignment with the corresponding subregions of mask 7.

It is possible that local heating from absorption by the mask of an electron beam might cause local shifting of individual mask areas due to thermal expansion, so that apart from the overlay errors measured by interferometric arrangement 12, additional positioning errors might appear which are caused by local shifting of individual mask areas. Local positioning errors might also be caused by local distortions of semiconductor wafer 8 which can be caused, for example, by heat treatments of semiconductor wafer 8 between two successive exposures.

Figure 3:
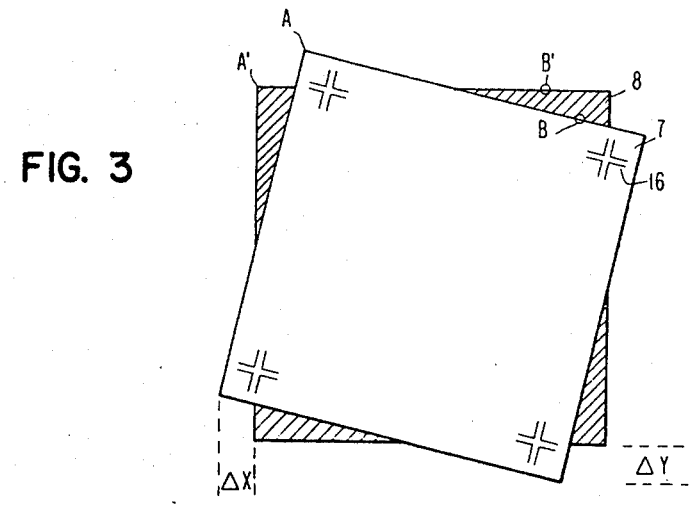
FIGS. 3, 4 and 5 are representations of various overlay errors.
Figure 4:
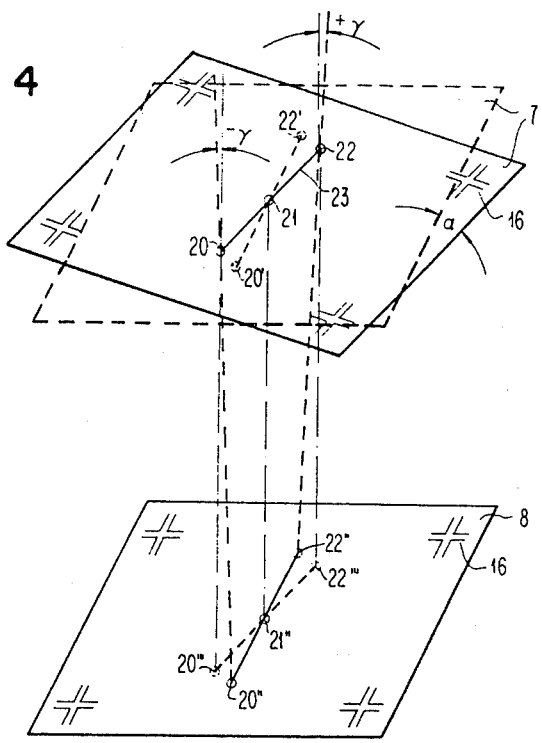

In FIGS. 3 and 4, mask 7 is rotated relative to semiconductor wafer 8. The angular amount $\alpha$ of this rotation can be detected either by interferometric arrangement 12 shown in FIGS. 1 and 2, or by scanning alignment marks 16. FIG. 3 shows that in a precise pattern transfer of mask 7 onto semiconductor wafer 8, points A and B of mask 7 should be imaged at locations A' and B' of semiconductor wafer 8. If the distance between the mask and semiconductor wafer is known, as well as the positioning errors, points A and B can be imaged at locations A' and B' with the device of FIG. 1 in spite of the positioning errors by tilting electron beam 2 during exposure or printing of the respective mask points, by an angle which compensates for the local displacements. The displacements $\Delta x$ and $\Delta y$ appearing in the individual subareas due to the rotational error $\alpha$ quite obviously vary with the location of the subarea and depend also on the rotational angle $\alpha$ which has been determined from the interferometric measurements or from scanning alignment markings 16, as follows:

$$\Delta x = \alpha \cdot y$$

$$\Delta y = -\alpha \cdot x$$

where x and y represent the position of a subarea in an X-Y coordinate system having an origin at the rotational center. The necessary corrections for the rotational error are achieved by means of the electrostatic or electromagnetic deflector 6 of the device shown in FIG. 1, which controllably tilts electron beam 2 by a varying angle $\gamma$ calculated using simple geometrical relationships from the rotational error $\alpha$, the amount of separation between the mask and wafer, and the position of the subarea with respect to the rotational center. It should be apparent that if there is only a rotational error, then the beam would be tilted perpendicular to a radius line coming from the rotational center. Further overlay errors caused by a linear shifting of mask 7 relative to semiconductor wafer 8 in the X and/or Y direction may of course be superimposed upon the overlay errors caused by a rotation of the mask with respect to the wafer. In general, the beam is tilted each time in the azimuth direction of the alignment error determined for the subarea being exposed and the tangent of the angle of tilt taken with respect to a perpendicular or normal direction to the wafer is each time equal to the product of the magnitude of the alignment error and the distance between the mask and the semiconductor wafer at the subarea being exposed. This may be expressed as $$\Delta p = d \tan \alpha$$

where $\Delta p$ is the difference between the actual and nominal positions of the subarea being exposed, d is the distance between the mask and the semiconductor wafer, and $\alpha$ is the tilt angle of the electron beam. The azimuth direction of the tilting is equal to the direction or vector angle of $\Delta p$.

Correction of an overlay error caused by a rotation of mask 7 with respect to semiconductor wafer 8 may be more fully understood by referring to FIG. 4, which is a perspective representation of the arrangement of FIG. 3, the distance between mask 7 and semiconductor wafer 8 having been increased for better understanding. In the nominal position of mask 7 as represented by dotted lines the openings 20', 21 and 22' to be transferred would, with a vertical incidence of electron beam 2, be transferred into the areas of semiconductor wafer 8 which are marked 20'', 21'', and 22''. When mask 7 is rotated with respect to its nominal position by an angle $\alpha$, to the position shown in FIG. 4 by continuous lines, the openings of mask 7 which are marked 20 and 22 would be transferred by a vertical incidence electron beam into the areas of semiconductor wafer 8 which are marked 20''' and 22''', and which are not in the correct position. Openings 20 and 22 of mask 7 may be transferred into the correct nominal positions marked 20'' and 22'' by appropriately tilting the electron beam such that it follows the broken lines shown. Mask opening 21 which lies in the point of rotation of the mask is transferred in both shown positions of mask 7 into the actual position 21'' with vertical incidence of the electron beam. In the transfer of line 23 connecting openings 20 and 22 (openings 20 and 22 being here assumed to be equally distant from opening 21), the electron beam would obviously have to be tilted at an angle which decreases from $-\gamma$ to zero and then increases again to $+\gamma$.

Figure 5:
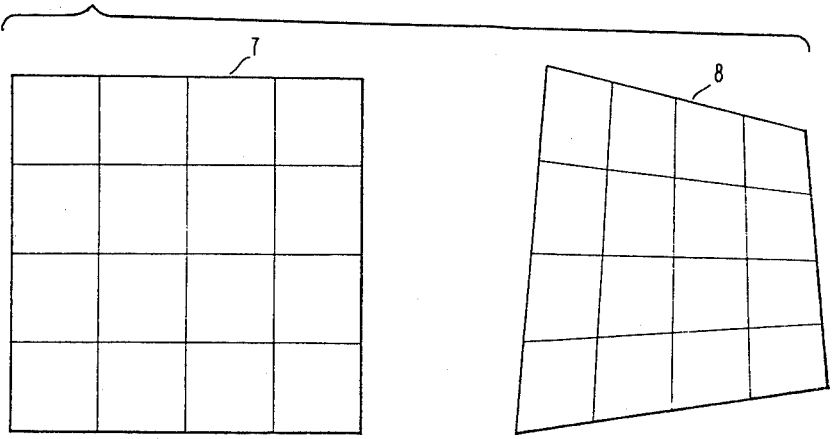

FIG. 5 shows a semiconductor wafer which after a series of heat treatment processes has been distorted by changes in dimensions which are locally different in different directions. In a spot-wise transfer of patterns which are contained in mask 7 onto semiconductor wafer 8 the electron beam must be tilted by corresponding angles which in general compensate for the dimension distortions.

Since heating necessarily occurs when an electron beam strikes a mask, thermal expansion can cause distortions of the mask. Special precautions can be taken for keeping this heating as low as possible. This is particularly important when complementary masks are used since with such masks the ratio of the open area of the mask to the area which is not open is particularly small. Furthermore, with this type of mask the total area occupied by openings per unit area of the mask is not uniform.

For avoiding the above-mentioned disadvantages either the total scanning time must be short compared with the thermal time constant or a scanning arrangement must be selected which tends to uniformly heat the mask.

In the former case, the beam sweeps over the mask with such a high speed that the exposure has the same thermal effect upon the mask as a flood beam. These conditions for instance, apply when a full raster scan is completed within a time period equal to no more than the thermal time constant of the mask. This substantially avoids local temperature peaks and produces the lowest temperature increases.

If for technical reasons the required radiation dosage cannot be directed onto the mask in such a short scanning time, the scanning must be suitably divided locally and/or with respect to time. For example, the mask can be scanned completely several times, each raster scan providing only a fraction of the total radiation dosage required. Each individual raster scan preferably should then be completed within a time period equal to no more than the thermal time constant of the mask so that thermal distortions do not occur. The sum of all the partial exposures would then equal the desired total exposure. A similar effect could be obtained with interlaced scanning, where each scan of the field covers only a portion of the subareas, a total of two or more partial scans being required to cover all of the subareas much as is done with television. In this case each partial scan of the interlaced scan preferably should be completed within a time period equal to no more than the thermal time constant of the mask.

Figure 6:
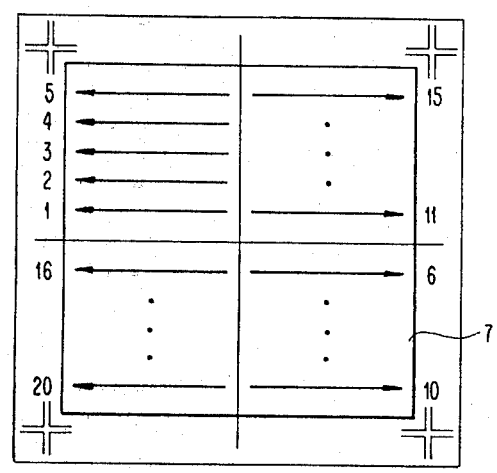
FIG. 6 is a scanning diagram.

FIG. 6 illustrates another scanning method. The scanning field is divided into four equal partial fields and each partial field is scanned starting from the center of the mask and proceeding toward a mask corner. In this method, when the scanning has reached a mask corner, the heat in the center part of the mask has already been conveyed to the outside via the remaining unscanned mask quadrants. As shown by the numbers of the scanning tracks of FIG. 6, the second partial scanning is effected in the lower right-hand partial field, again starting from the center of the mask. Subsequently, the upper right-hand and the lower left-hand partial fields are scanned as indicated. This can of course also be combined with interlaced scanning, or with any other of the above-described methods for reducing thermal distortion.

It is also possible to increase the heat capacity of the mask so that the temperature of the mask at a predetermined radiation dosage does not exceed a predetermined amount.

Another way of reducing thermal distortions is to form the mask as a lamination structure. One particularly advantageous laminate is silicon thin film with a thick gold coating.

The described method for avoiding thermally induced dimensional distortions may of course be used in situations other than in connection with shadow printing with particle beams. These methods may be used to advantage whenever a mask is scanned spotwise by a beam.

Having thus described our invention, what we claim as new, and desire to secure by Letters Patent is:

1. A method of exposing a target surface to particle beam radiation by shadow printing, comprising the steps of:
arranging a mask suitable close to and in front of a target surface and at approximately a predetermined alignment position with respect to said target surface;
forming a particle beam having a cross-section which is much smaller than the whole region of said mask to be exposed to said particle beam at said predetermined alignment position;

subdividing said whole mask region to be exposed to said particle beam into a multiplicity of individual subareas;

determining the individual alignment error of each of said subareas of said mask region by determining the deviation of the actual position of each individual subarea from a predetermined nominal position thereof;

steering said particle beam so as to expose said individual subareas of mask region successively to said particle beam; and while exposing each successive subarea to said particle beam, compensating for the individual alignment error determined for said subarea by controllably tilting said particle beam in a direction and by an amount corresponding to said individually determined alignment error.

2. A method as defined in claim 1 wherein the individual alignment errors of said subareas are determined by measuring alignment error for said mask region to be exposed and then computing therefrom individual alignment errors for each subarea thereof.

3. A method as defined in claim 2 wherein alignment error is measured by interferometric measurement.

4. A method as defined in claim 2 wherein alignment error is measured by scanning alignment marks on said mask and target surface.

5. A method as defined in claim 1 wherein said particle beam is controllably tilted each time in the azimuth direction of the alignment error determined for the subarea being exposed and the tangent of the tilt angle taken with respect to the normal of said target surface is each time equal to the product of the magnitude of the alignment error and the distance between said mask and target surface at the subarea being exposed.

6. A method as defined in claim 1 wherein all of said subareas of said mask region are exposed to said particle beam within a time period equal to no more than the thermal time constant of said mask.

7. A method as defined in claim 1 wherein said subareas of said mask region are exposed to said particle beam a plurality of times without changing said predetermined alignment position, said subareas receiving during each partial exposure only a fraction of the total desired exposure, each partial exposure of said subareas being completed within a time period equal to no more than the thermal time constant of said mask.

8. A method as defined in claim 1 wherein said particle beam is steered to scan said subareas in interlaced fashion, each partial scan of the interlaced scan being completed within a time period equal to no more than the thermal time constant of said mask.

9. A method as defined in claim 1 wherein said mask region to be scanned is subdivided into separate scanning fields and each field is successively scanned starting each time at the position in the field which is closest to the center of the mask region.

10. A method as defined in claim 1 wherein said mask is a laminated structure to resist thermal expansion induced distortion thereof.

11. A method as defined in claim 10 wherein said mask is a silicon thin film mask carrying a thick gold coating.

* * * * *